United States Patent [19]

Guerrero

[11] Patent Number: 5,842,512
[45] Date of Patent: Dec. 1, 1998

[54] HEAT SINK ASSEMBLY

[75] Inventor: Fred Guerrero, North Hollywood, Calif.

[73] Assignee: International Electronic Research Corporation, Burbank, Calif.

[21] Appl. No.: 777,610

[22] Filed: Dec. 31, 1996

[51] Int. Cl.[6] .................................. F28F 7/00; H05K 7/20
[52] U.S. Cl. .................... 165/80.3; 165/185; 257/719; 361/704; 24/295
[58] Field of Search .................... 165/185, 80.3; 361/704, 707; 24/67.9, 295, 458, 563; 257/718, 719

[56] References Cited

U.S. PATENT DOCUMENTS

| 2,567,508 | 9/1951 | Carson | 24/458 |
|---|---|---|---|
| 2,728,259 | 12/1955 | Poupitch | 24/295 |
| 4,382,414 | 5/1983 | Svirklys | 24/295 X |
| 4,933,746 | 6/1990 | King | 257/718 |
| 5,109,317 | 4/1992 | Miyamoto et al. | 257/719 X |
| 5,201,866 | 4/1993 | Mok | 165/80.3 |
| 5,241,727 | 9/1993 | Lee | 24/295 X |
| 5,331,507 | 7/1994 | Kyung et al. | 24/458 X |
| 5,570,271 | 10/1996 | Lavochkin | 361/704 |
| 5,581,441 | 12/1996 | Porter | 257/719 X |
| 5,615,735 | 4/1997 | Yoshida et al. | 165/80.3 |

FOREIGN PATENT DOCUMENTS

4226816  2/1994  Germany .................... 257/718

*Primary Examiner*—Leonard R. Leo
*Attorney, Agent, or Firm*—Bruce A. Jagger

[57] ABSTRACT

A heat dissipating assembly is provided wherein a heat emitting plate is clamped to the heat receiving base of a heat sink by means of a releasable spring loaded clip. The spring loaded clip includes a pressure plate, and legs which terminate in detente elements. The legs are adapted to extend through the two plates so as to position the detente elements on one side of the heat exchanging plates, and the pressure plate on the other. The spring loading, acting on the pressure plate, serves to clamp the two heat exchanging plates between the pressure plate and the detente elements. The spring loading also serves to urge the legs laterally so that the detente elements engage firmly with an opposed side of the heat emitting plate.

9 Claims, 6 Drawing Sheets

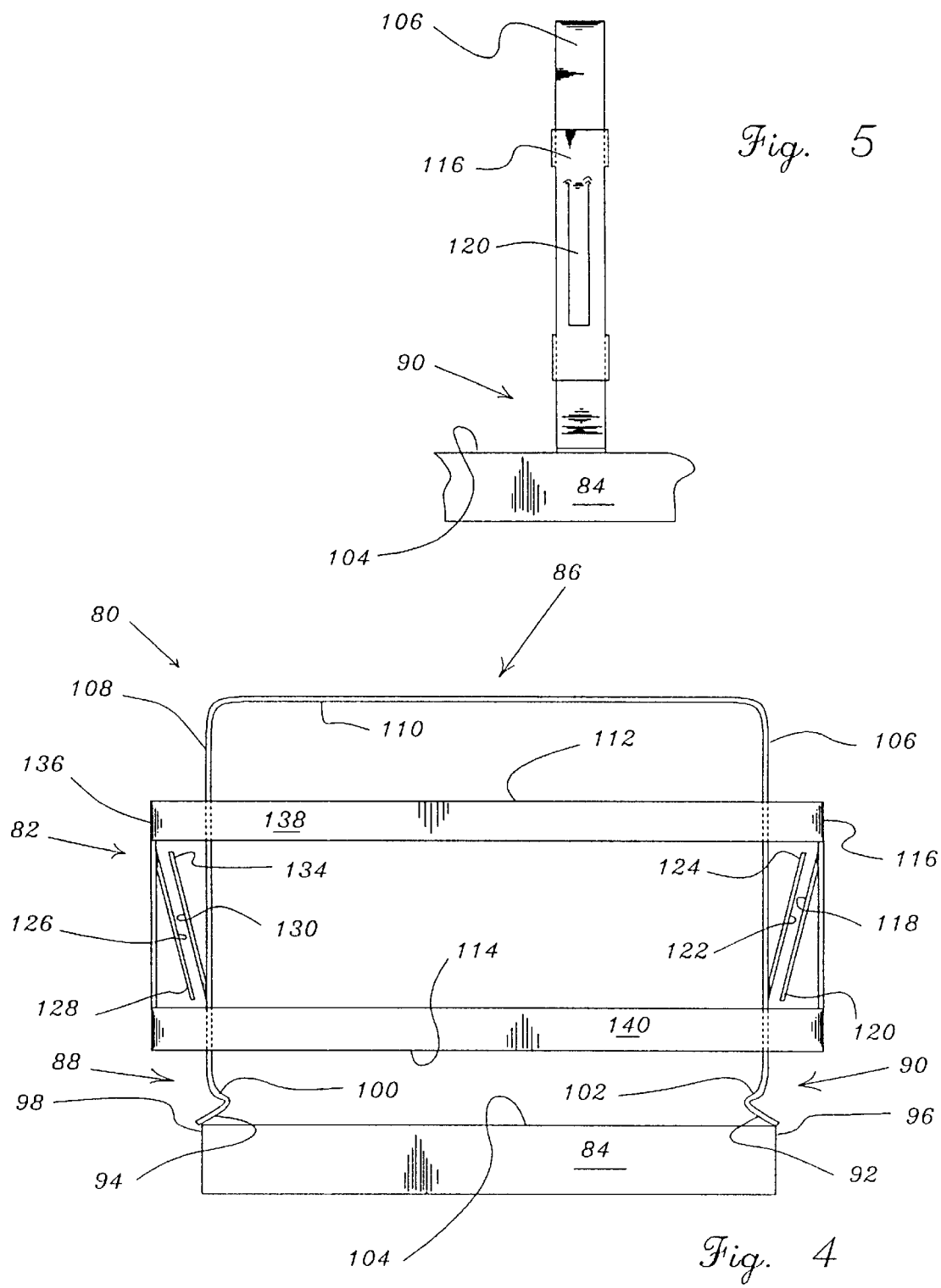

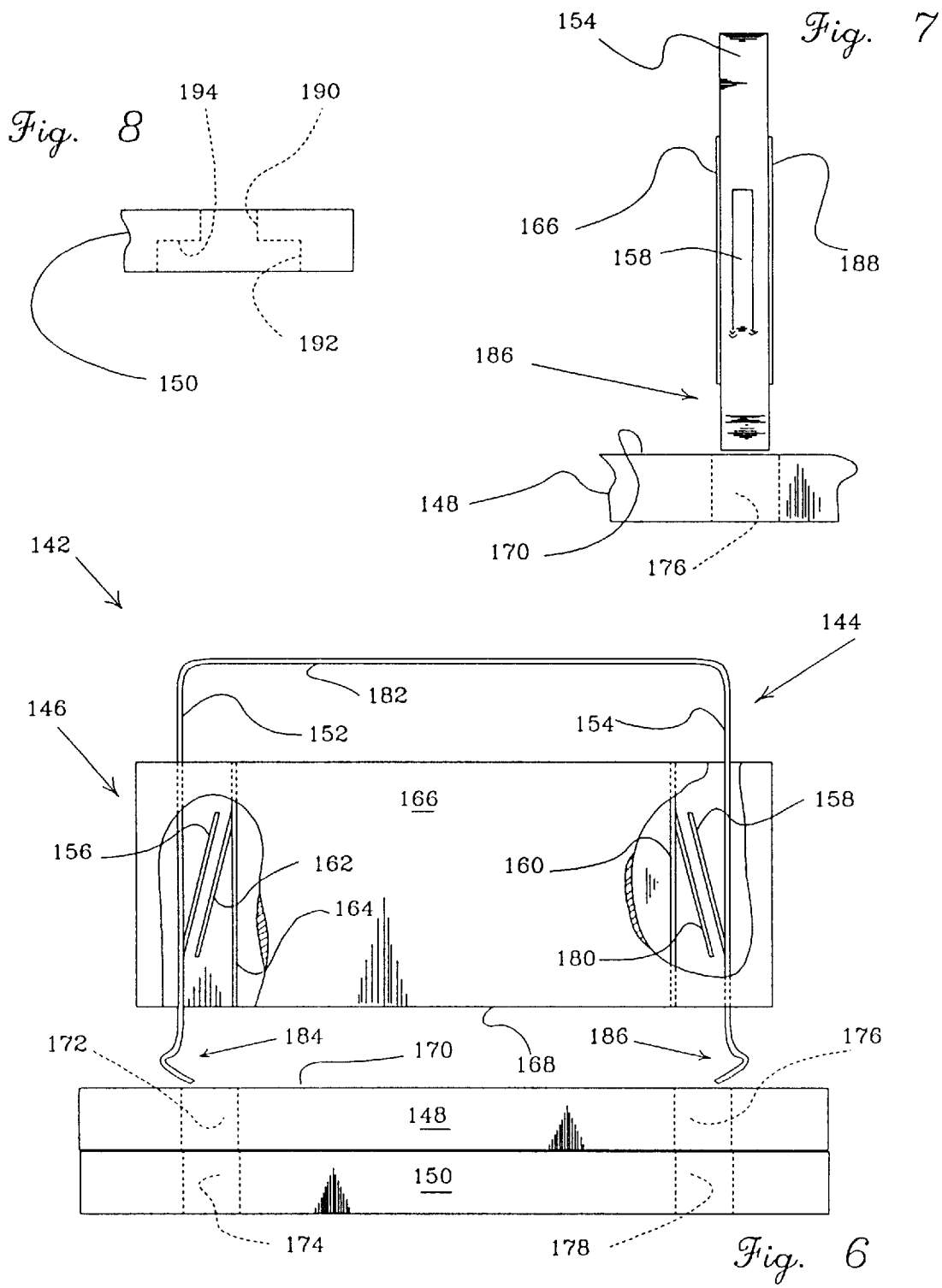

HEAT SINK ASSEMBLY

BACKGROUND OF THE INVENTION

1. Field of the Invention

The invention relates in general to heat sink assemblies and, in particular, to heat sink assemblies in which a heat sink is held in resilient assembled relationship with a heat emitting source by a spring biased latching member.

2. Description of the Prior Art

The miniaturization of electronic devices, such as chips and packages, has resulted in more and more heat being emitted from smaller and smaller components in shorter and shorter periods of time. Many installations do not permit the use of high rates of air flow, either for power consumption or noise reasons, or both. Rapidly transferring large amounts of heat from small components under such conditions has proven to be very difficult.

In general, accomplishing the transfer of heat from electronic devices had involved the use of heat sinks strapped to the devices by a tensioned strap. The increased rate of heat emission has now dictated that if heat sinks are to continue to be used they must be made more efficient. The accomplishment of the necessary increase in efficiency has generally resulted in larger, bulkier heat sinks. This in turn has made it impossible to use the previous clips or tensioning devices to hold the more efficient heat sinks in heat dissipating assembled relationship with the heat emitting electronic devices. The previous clips have proven to be particularly deficient in holding the new heat sinks under conditions of shock and vibration. This is in part because the new more efficient heat sinks are more massive and their centers of gravity are in different locations. Without clips which are adequate to hold the more efficient heat sinks in place they can not be used. Further, the conditions of use often dictate that the heat dissipating assemblies be installed and removed by hand without the aid of tools. Also, the clips must be reusable.

Those concerned with these problems recognize the need for an improved heat sink holding device.

BRIEF SUMMARY OF THE INVENTION

A preferred embodiment of the heat dissipating assembly according to the present invention comprises a heat sink with a base member in the form of a heat receiving plate, a heat emitting structure including a heat emitting plate, and a releasable spring loaded latching device or clip which locks or clamps the two together and resiliently resists dislodgment. The spring loaded clip includes a pressure plate, and legs which terminate in detente elements. The legs are adapted to extend through the two plates so as to position the detente elements on one side of the heat exchanging plates, and the pressure plate on the other. The spring loading, acting on the pressure plate, serves to clamp the two heat exchanging plates between the pressure plate and the detente elements. The spring loading also serves to urge the legs laterally so that the detente elements engage firmly with an opposed side of the heat emitting plate.

The leg members generally project from a location adjacent a first surface of the heat receiving plate through or past the edge of the heat receiving plate and into engagement with some heat emitting structure which is in heat transferring relationship with the opposed side of the heat receiving base member or plate. The detente elements are thus located to engage with the heat emitting structure at a location which is generally opposed to the first surface of the heat receiving plate.

The latching devices include a spring loaded pressure plate or bearing member which is positioned to bear resiliently against the first surface of the heat receiving plate when the detente elements are engaged with an opposed side of the heat emitting structure. The heat emitting structure and the heat receiving plate are thus resiliently locked or clamped together between the pressure plate and the detente elements. In general the clamping spring load is applied longitudinally of the leg members. The force which urges the detentes laterally is generally applied to the leg members which carry the detente elements. The force is applied in a direction which is approximately normal to the direction of the clamping spring load. In general, the same spring element which resiliently clamps the two heat transfer members between the bearing member and the detente elements is also utilized to exert a resilient load on the leg members so as to bias the detente elements into engagement with the opposed side of the heat emitting structure. The legs can be biased either towards or away from one another, depending upon the configuration of the system.

The heat sink generally includes a base member that has one surface which is shaped so as to conform closely with the surface of a heat emitting structure so that heat will flow between the two by conduction. Conductive heat transfer is much more efficient than, for example, heat transfer by radiation. The two structures can be mounted for conductive heat transfer in direct heat exchanging contact with one another or in heat exchanging contact through a deformable thermally conductive layer, such as an adhesive layer, positioned between them. In some circumstances heat transfer can be enhanced by using a deformable thermally conductive layer which conforms exactly to the mating surfaces of both parts. As will be understood by those skilled in the art, these parts are in heat exchanging contact whether that contact is direct or through a thermally conductive layer. In general, the heat receiving base member and the heat emitting structure are plate-like and their mating surfaces are generally planar.

The spring member serves to bias the parts of the heat sink assembly into resilient engagement with one another. The design is preferably such that a small deflection of the spring element will result in generating the necessary loads. When small spring deflections are used the spring member can be constructed of either stainless steel or beryllium copper. Both of these materials are non-magnetic so they do not present any risk of generating magnetic interference which might damage or impair the functioning of sensitive electronic components. Stainless steel also provides the additional advantage that it does not require heat treating. Heat treating conventional steel springs requires extra manufacturing steps and makes it difficult to maintain the necessary tolerances and other dimensions. Neither stainless steel nor beryllium copper will function through the large ranges of deflection which conventional steel springs tolerate. The low deflection designs according to the present invention permit the use of spring materials which provide substantial improvements over conventional steel spring materials. Organic plastic spring materials may also be used, if desired. The strength of the latching device can be varied simply by changing the thickness of the spring material. Where greater security is required heavier springs can be used.

Preferred spring configurations include, for example, generally Z-shaped compression leaf springs, cantilevered leaf springs, co-acting leaf springs, and the like. Z-shaped spring members can include one or more Z-shaped segments with generally straight mid-segments extending between loops.

Other objects, advantages, and novel features of the present invention will become apparent from the following detailed description of the invention when considered in conjunction with the accompanying drawings.

BRIEF DESCRIPTION OF THE DRAWINGS

The present invention provides its benefits across a broad spectrum of heat sink assemblies. While the description which follows hereinafter is meant to be representative of a number of such applications, it is not exhaustive. As those skilled in the art will recognize, the basic methods and apparatus taught herein can be readily adapted to many heat sink assemblies. It is applicant's intent that this specification and the claims appended hereto be accorded a breadth in keeping with the scope and spirit of the invention being disclosed despite what might appear to be limiting language imposed by the requirements of referring to the specific examples disclosed.

Referring particularly to the drawings for the purposes of illustration only and not limitation:

FIG. 4 is front elevational view of a further embodiment of a spring loaded latching device according to the present invention wherein co-acting leaf spring members urge detente elements towards one another.

FIG. 5 is a side elevational view of the spring loaded latching device of FIG. 4.

FIG. 6 is a partially cut-away front elevational view of a further embodiment of a spring latching device of the present invention wherein co-acting cantilevered leaf spring elements urge detente elements away from each other.

FIG. 7 is a font elevational view of the embodiment of FIG. 6.

FIG. 8 is a broken side elevational view of an embodiment of a latching port.

DETAILED DESCRIPTION OF THE PREFERRED EMBODIMENTS

Figure 1:
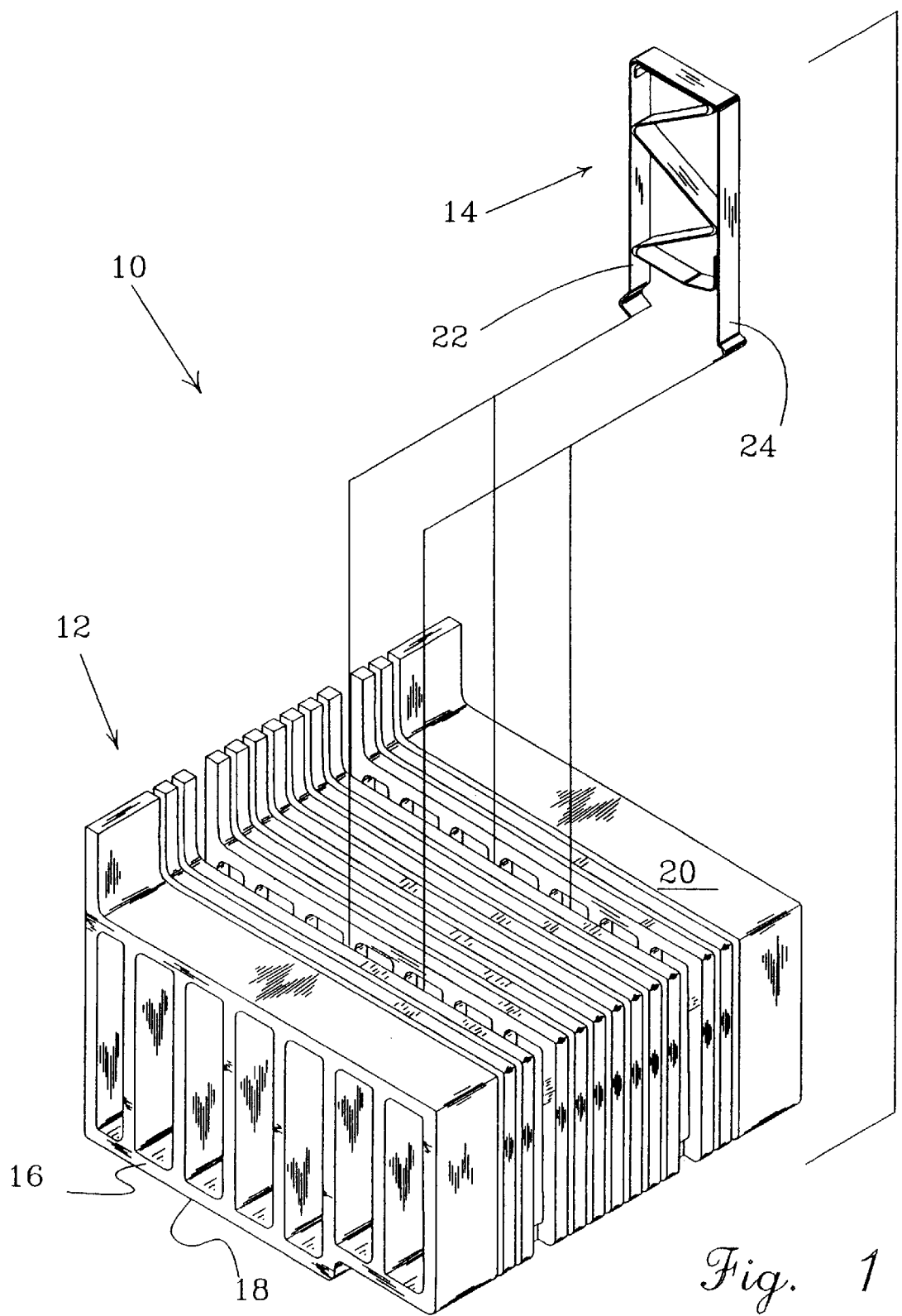
FIG. 1 is an exploded perspective view of a preferred embodiment of the heat dissipating assembly according to the present invention.
Figure 2:
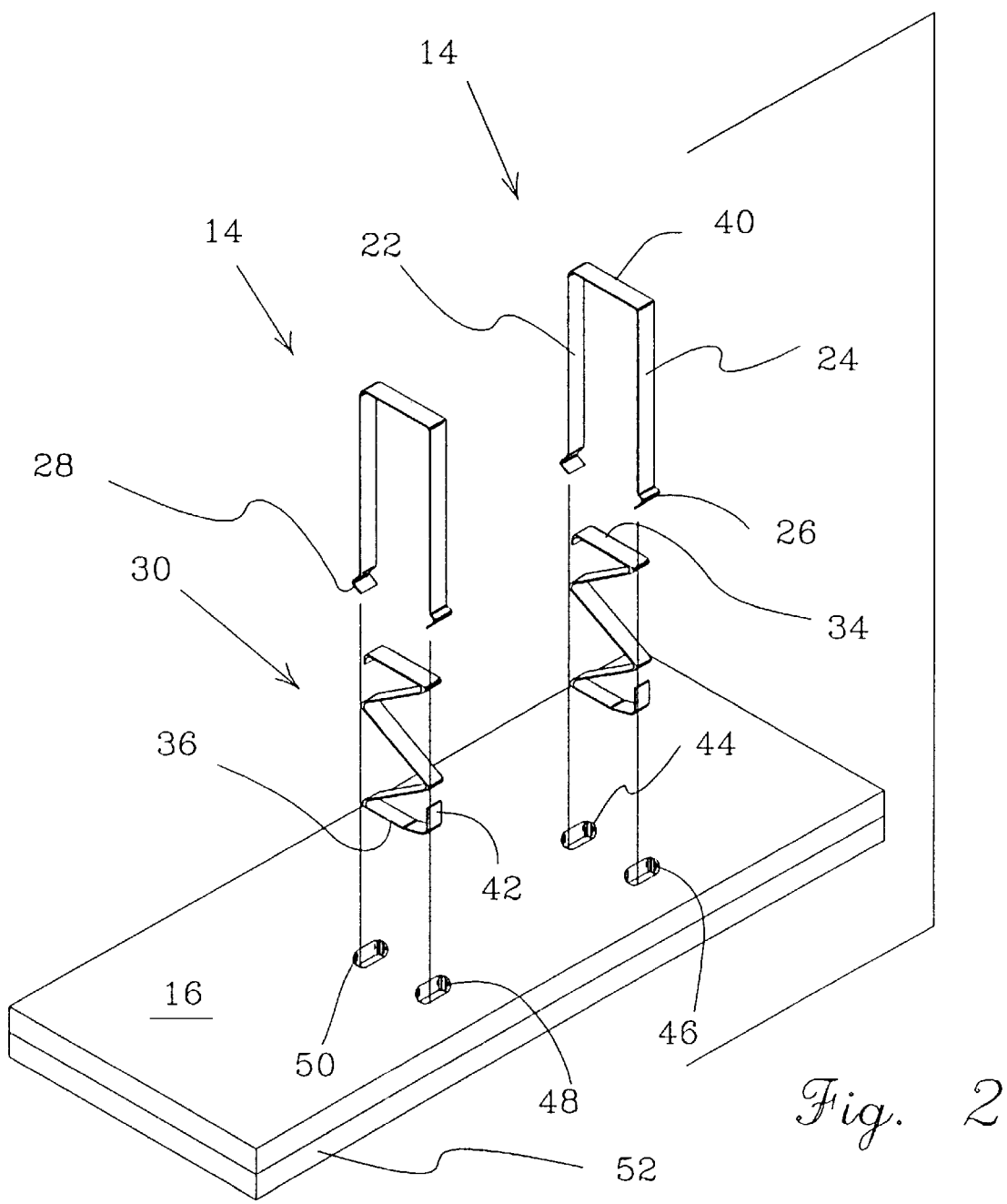
FIG. 2 is a diagrammatic exploded perspective view of the embodiment of FIG. 1.
Figure 9:
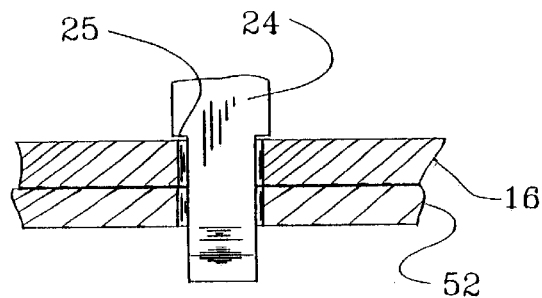
FIG. 9 is a broken, cross-sectional side elevational view of an embodiment of a detente element projected through registered latching ports in heat emitting and receiving structures.
Figure 10:
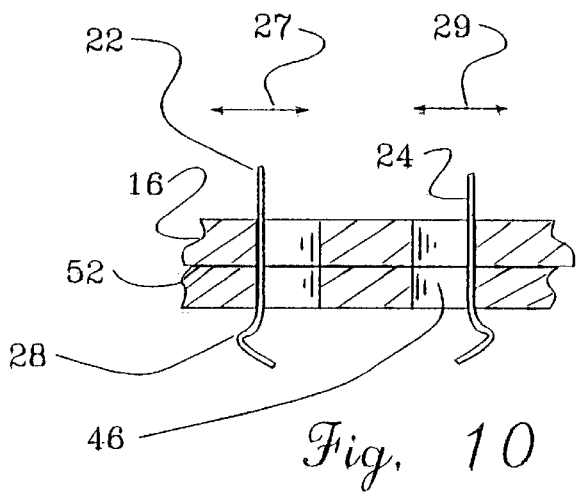
FIG. 10 is a broken, cross-sectional front elevational view of an embodiment of the present invention illustrating the lateral range of travel of the leg members.
Figure 3:
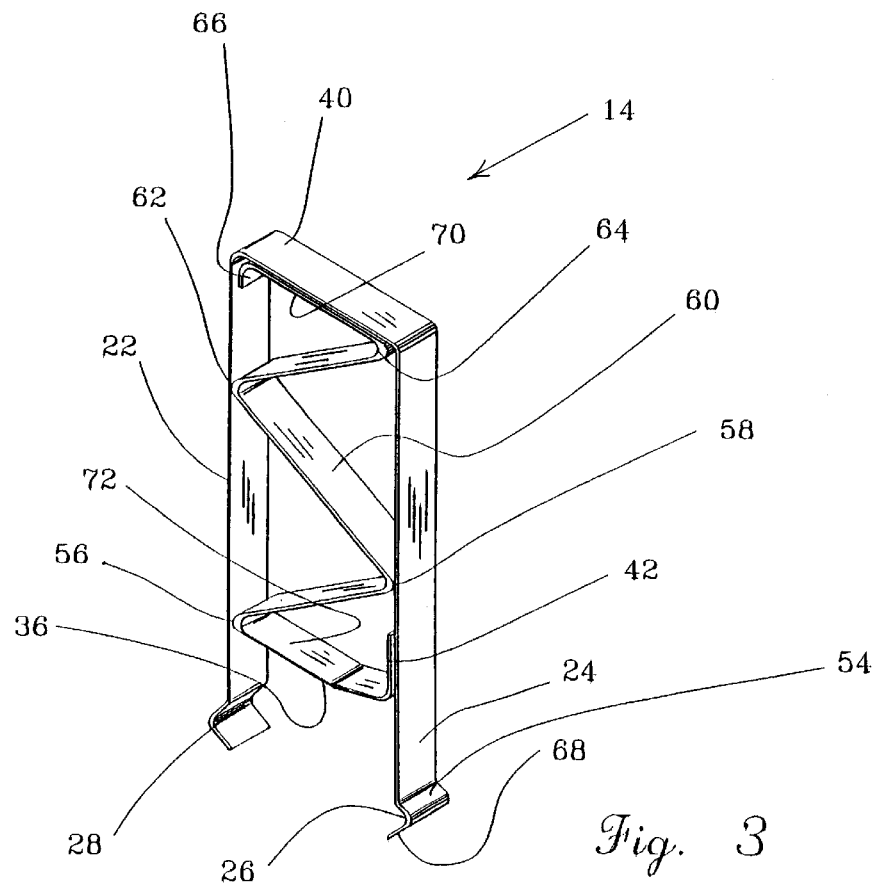
FIG. 3 is a perspective view of the embodiment of the latching device shown in FIG. 1.

Referring now to the drawings wherein like reference numerals designate identical or corresponding parts throughout the several views. Generally, equivalent parts may be identified by the same terminology with reference to different specific embodiments. In the preferred embodiment, referred to for purposes of illustration only and not limitation, there is illustrated generally at 10, a heat dissipating assembly which includes a generally U-shaped clip or latching device 14, and a heat sink 12. See particularly FIGS. 1–3, 9, 10, and 12.

Figure 11:
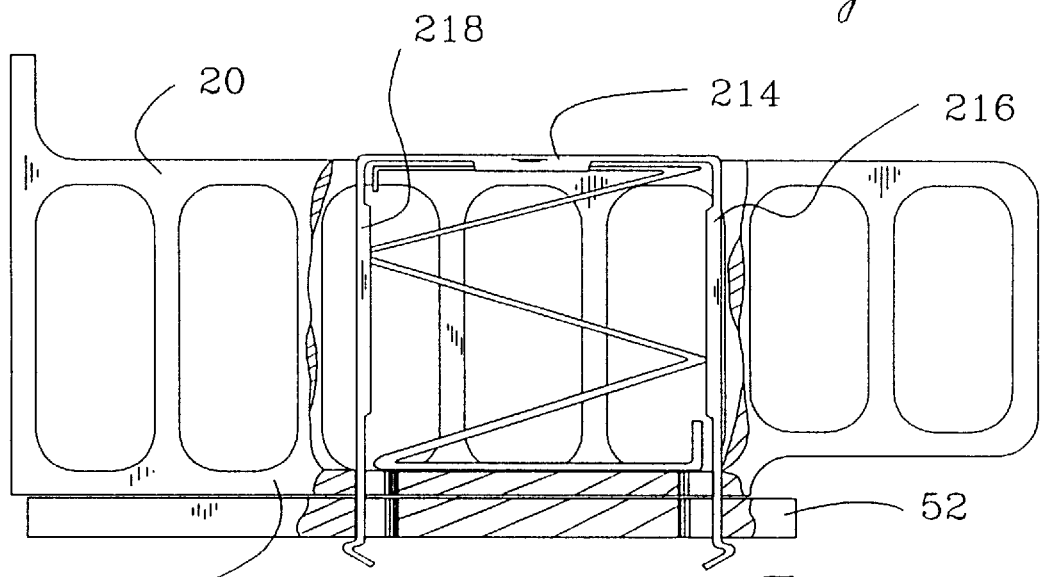
FIG. 11 is a cut-away, partially cross-sectioned front elevational view of the embodiment of FIG. 1 showing the heat dissipating assembly fully assembled.

The heat sink 12 includes a heat receiving base member or plate 16, and heat dissipating projections 20. For purposes of illustration, the heat dissipating projections are not shown in FIG. 3. Base member 16 includes a heat receiving side or surface 18. In general, the heat dissipating projections 20 project from a side of the base member which is opposed to the heat receiving side 18. In general, the heat receiving side 18 of base 16 is adapted to be mounted in heat conducting relationship with the heat emitting side or surface of a heat emitting structure or plate 52. Plate 52 is generally a part of or mounted to a heat emitting electronic component such as a chip or a package, not illustrated. Latching ports 44, 46, 48 and 50 are provided through both the heat emitting and heat receiving structures. The ports in the respective structures are aligned in registry so that the leg members 22 and 24 of the latching device 14 pass through both. In this way the two structures are secured releasably and resiliently together. See, for example, FIGS. 9–11.

The latching device or clip 14 comprises two pieces one of which includes leg members 22 and 24 which project generally parallel to one another from opposed ends of base 40. Leg members 22 and 24 terminate in detente or latching elements 26 and 28. Together, legs 22 and 24, and base 40 serve to mount both the integral detente elements 26 and 28, and a separate generally Z-shaped spring member 30. The structure which comprises legs 22 and 24 and base 40 also defines a housing or cage for a Z-shaped spring member 30. In general, the housing or cage includes retaining or guiding tabs for the Z-shaped spring member which, for the purposes of illustration, are not shown except in FIG. 11. The normally top leaf 34 of generally Z-shaped leaf spring member 30 bears against the inside surface 70 of base 40 so that the application of force to base 40 is carried through to top leaf 34. The force is carried through the leaf spring 30 from top leaf 34 to first spring loop 64, through a generally straight segment to second spring loop 62, through cross bar leaf 60 to third spring loop 58, through a second generally straight leaf segment to fourth spring loop 56, finally and into pressure plate or bearing member 72.

During assembly the leg members 22 and 24 are inserted through the latching ports 44 and 46, or latching ports 48 and 50, respectively. That insertion is facilitated by the presence of ramp surface 68 on the leading edges of the detente elements 26 and 28. The detente elements slide over the edges of the latching ports at the start of the insertion operation and the legs are deflected inwardly as shown, for example, at 27 and 29 in FIG. 10. As assembly of the clip 14 to the heat sink 12 commences, the bottom surface 36 of bearing member 72 is brought into contact with the top surface of base member 16. As installation force is applied against base 40 the leaf spring member 30 is compressed between the underside 70 of base 40 and the top surface of base member 16 until the latching surfaces 54 of detente elements 26 and 28 are located in a position to engage the opposed side of the heat emitting structure 52, as shown, for example, in FIG. 11. As the installation of clip 14 is completed and the detente elements engage the opposed surface of heat emitting base 52 the legs move laterally apart as shown, for example, at 27 and 29 in FIG. 10. If desired, a shoulder 25 can be provided on the leg members which serves as a stop to prevent inserting the legs too far into the latching ports. See, for example, FIGS. 9 and 10. The leaf spring member 30 is stabilized during assembly to the heat sink 12 by means of a stabilizing foot 66 on top leaf 34, and stabilizing shoe 42 on pressure plate or bearing member 72.

Figure 12:
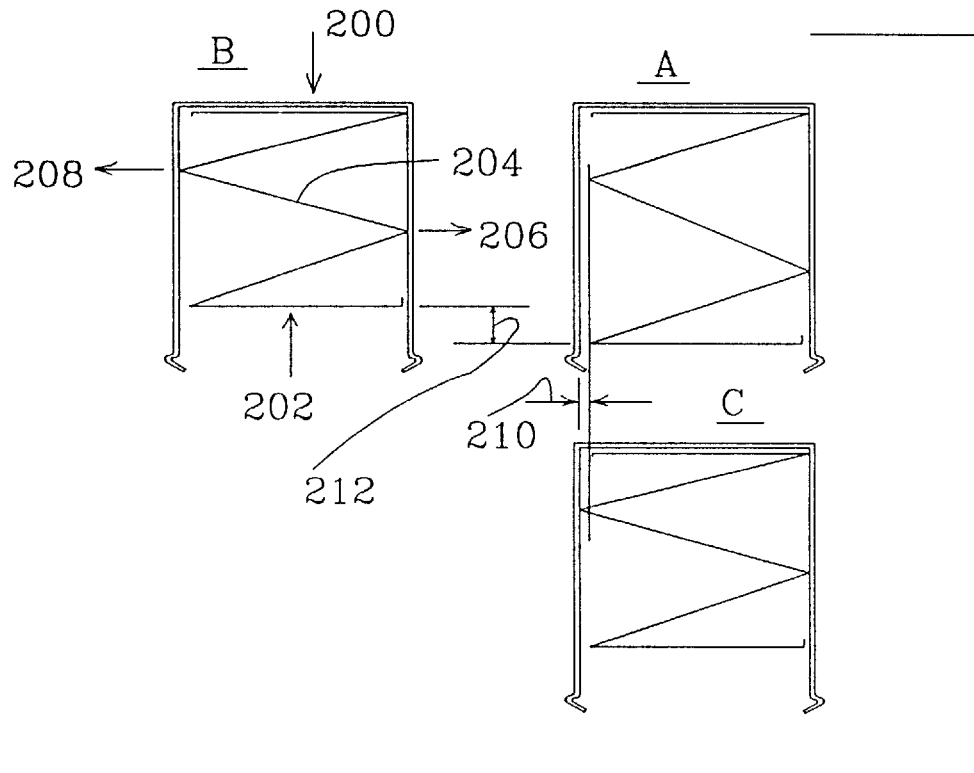
FIG. 12 is diagrammatic sequential view of an embodiment of a spring clip according to the present invention illustrating the compression and lateral deflection of the Z-shaped leaf spring member.

Diagrammatic sequential FIG. 12 indicates how the application of insertion force to the generally Z-shaped spring member results in generating the necessary resilient latching forces. The amount of the deflection of the spring member is exaggerated in FIG. 12 for the purposes of illustration. View A illustrates the clip in the unassembled configuration with the leaf spring untensioned. Views B and C illustrate the clip in the fully assembled configuration with the spring fully tensioned. As an assembly force 200 is applied to the clip, the base of the heat receiving member resists and generates a reaction 202. As the spring is compressed along its resilient axis, which is generally parallel with the leg members, to its fully compressed position the bearing plate moves through a range indicated at 212. That compression causes the lateral spring leaf segment or bar 204 to rotate towards a position which would be closer to parallel with the bearing plate. This rotation causes the ends of bar 204 to exert forces 206 and 208 outwardly against the legs. The forces generated by the rotation of the bar 204 are generally lateral or normal to the resilient axis of the spring member. The resilient axis is generally parallel to the legs in the embodiment illustrated in FIG. 12. The ends of the bar 204, when considered relative to the legs, move laterally by an amount indicated at 210. The bar, of course, stays the same length. It is the position of the opposed ends of the bar relative to the rest of the structure of the clip which causes the lateral spreading movement indicated at 210. The lateral opposed movement of the legs carries the detente elements apart from one another and into firm, releasable, resilient engagement with the opposed surface of the heat emitting structure. The compression of the spring member along its resilient axis causes the heat emitting and heat receiving structures to be clamped between the bearing member and the detente elements. The detente elements are thus urged both laterally in opposite directions and upwardly into engagement with an opposed side of the heat emitting structure. The heat dissipating assembly is thus resiliently and releasably latched together an assembled configuration. It will be understood by those skilled in the art that whenever terms of direction such as upwardly, vertically, outwardly, or the like, are used in this disclosure or in the claims appended hereto, they are not intended to indicate orientation relative to the horizon. Rather, they are intended to indicate orientation relative to the other parts of the clip. The vertical, downward or upward directions are generally approximately parallel to the legs, and outward or lateral directions are generally approximately normal to the legs.

The embodiment illustrated particularly in FIGS. 4 and 5 comprises a latching device indicated generally at 80 which includes a generally U-shaped clip member 86. The spring elements in this embodiment are configured so as to urge the detente elements resiliently towards one another. Clip member 86 includes leg members 106 and 108 which terminate in detente elements 90 and 88, respectively. A sleeve member indicated generally at 82 is defined by cage member 138, bearing member 140, and end plates 116 and 136. The generally U-shaped clip member 86 is slidably received within sleeve member 82. Latching device 80 is adapted to be mounted on the heat emitting side of base member 84. The heat dissipating projections which would normally be on base member 84 have been omitted for purposes of illustration. cantilevered leaf spring elements 120 and 128 are sheared out of end plates 116 and 136, respectively. The free ends of leaf spring elements 120 and 128 project towards the leg members 106 and 108, respectively. Cantilevered leaf spring elements 124 and 134 are sheared out of leg members 106 and 108, respectively, with their free ends projecting towards end plates 116 and 136. The leaf spring elements 120 and 124 co-act with one another, and leaf spring elements 128 and 134 likewise co-act with one another as sleeve member 82 and the generally U-shaped clip 86 slid axially relative to one another. As the upper edge 112 of sleeve member 82 moves towards the bottom side 110 of the cross-member of the clip member 86, the facing surfaces of leaf spring elements 120 and 124 move into contact with one another. The co-acting surfaces 118 and 122 make contact and slide over one another, flexing as they do. Likewise, the co-acting surfaces 126 and 130 contact and slide relative to each other, flexing as they do. The flexing of these four spring elements applies resilient loads which tend to force the detente elements 88 and 90 both towards one another and upwardly. As downwardly directed installing force is applied to clip member 86 the co-acting spring surfaces 126–130 and 118–122 engage, and the sleeve member 82 is carried down with the clip member 86 until lower surface 114 of pressure plate or bearing member 140 comes into contact with upper bearing surface 104 of base member 84. At this point the sleeve member 82 stops moving downwardly and the leaf spring elements begin to deflect. The detente elements 88 and 90 are deflected outwardly by the respective ramp surfaces 94 and 92 sliding over the upper edges of base member 84 as the leg members 108 and 106 move downwardly. When fully deflected the detente elements move downwardly along the opposed sides 98 and 96 of base member 84 until they reach the lower edge of base member 84. The latching surfaces 100 and 102 resiliently and releasably engage with the opposed side of the base member 84 at its lower edges. The tensioned spring elements urge the latching surfaces upwardly and inwardly towards each other.

The heat dissipating assembly embodiment illustrated, for example, in FIGS. 6 and 7 is similar to that illustrated and described with reference to FIGS. 4 and 5, except that the cantilevered co-acting leaf spring elements 156–162 and 158–180 are positioned so as to urge the detente elements apart from one another. Latching device 142 comprises generally U-shaped clip member 144 and sleeve member 146 assembled together so that sleeve member 146 slidably receives U-shaped clip member 144 therewithin. Sleeve member 146 comprises retainer plates 166 and 188 which are spaced apart by walls 160 and 164. Leaf spring members 180 and 162 are sheared out of walls 160 and 164, respectively. Leaf spring elements 156 and 158 are sheared out of leg members 152 and 154, respectively. Heat receiving base member 148 is provided with latching ports 172 and 176 which extend therethrough from bearing surface 170 to an opposed side. Heat dissipating projections which would normally project upwardly from bearing surface 170 have been omitted for purposes of illustration. Heat emitting structure 150 includes latching ports 174 and 178 which are adapted to be placed in registry with the latching ports in heat receiving base 148. The lower edge 168 of sleeve member 146 serves as a pressure plate or foot which is adapted to bear against bearing surface 170 in the assembled configuration. In the assembled configuration the detente elements 184 and 186 are urged outwardly and upwardly by the co-acting leaf spring elements 156–162 and 158–160.

What has been described are preferred embodiments in which modifications and changes may be made without departing from the spirit and scope of the accompanying claims. Obviously, many modifications and variations of the present invention are possible in light of the above teachings. It is therefore to be understood that, within the scope of the appended claims, the invention may be practiced otherwise than as specifically described.

What is claimed is:

1. A spring loaded latching device for holding a heat receiving base member of a heat sink in heat dissipating relationship with a heat emitting structure for cooling an electronic device, said spring loaded latching device comprising:

a spring member comprising a Z-shaped compression leaf spring;

a plurality of leg members terminating in detente elements;

a bearing member, said spring member being operatively associated with said bearing member and said detente elements and adapted to resiliently clamp said heat receiving base member and said heat emitting structure between said bearing member and said detente elements, and to urge said detente elements laterally into engagement with said heat emitting structure.

2. A spring loaded latching device of claim 1 wherein said bearing member is carried by said spring member.

3. A spring loaded latching device of claim 1 wherein said bearing member is carried by said spring member and said detente elements are urged laterally by said spring member.

4. A spring loaded latching device of claim 1 wherein said detente elements are urged apart by said spring member.

5. A heat dissipating assembly for cooling an electronic device comprising:

a heat sink part including a heat receiving base member, heat dissipating elements projecting outwardly from a first side of said heat receiving base member, and a mounting port extending through said heat receiving base member from said first side to an opposed side of said heat receiving base member, said opposed side being adapted to being mounted in heat exchanging contact with an emitting side of a heat emitting structure, said heat emitting structure including a latching port extending therethrough from said emitting side to a generally opposed second side, said latching port being adapted to being positioned generally in registry with said mounting port;

a spring loaded latching device including leg members terminating in detente elements, said leg members being adapted to project through said ports from said first side to position said detente elements on said second side, a pressure plate member operatively associated with a spring member and adapted to resiliently bear against said first side to releasably trap said heat receiving base member and said heat emitting structure between said pressure plate member and said detente elements to hold said heat dissipating assembly in assembled configuration.

6. A heat dissipating assembly of claim 5 wherein said spring member is operatively associated with said detente elements and is adapted to urge said detente elements laterally into engagement with said second side.

7. A spring loaded latching device for holding a ported heat receiving plate in assembled configuration with a ported heat emitting plate for cooling an electronic device, said spring loaded latching device comprising:

a generally Z-shaped compression leaf spring member having at least one generally straight mid-segment, a generally U-shaped spring housing member having a base section, a pair of leg segments projecting from generally opposed ends of said base section and terminating in oppositely disposed retaining elements, said leg segments being adapted to extend through said ported heat receiving and heat emitting plates to position said retaining elements on an opposed side of said ported heat emitting plate, said generally Z-shaped compression leaf spring member being retained in said generally U-shaped housing member with said generally straight mid-segments extending between said leg segments, said generally Z-shaped compression leaf spring member being positioned for compression in a direction generally parallel to said leg segments, whereby compression of said generally Z-shaped compression leaf spring urges said leg segments away from one another and clamps said ported heat receiving plate in heat exchanging relationship with said heat emitting plate.

8. A spring loaded latching device for holding a heat receiving plate in heat dissipating relationship with a heat emitting plate for cooling an electronic device, said spring loaded latching device comprising:

a spring member comprising Z-shaped compression leaf spring;

a plurality of leg members terminating in detente elements;

a pressure plate member, said spring member being operatively associated with said pressure plate member and said detente elements and being adapted to resiliently clamp said heat receiving plate between said pressure plate member and said detente elements.

9. a spring loaded latching device of claim 8 wherein said spring member is composed of stainless steel.

* * * * *